(12) United States Patent
Unno

(10) Patent No.: US 8,193,473 B2
(45) Date of Patent: Jun. 5, 2012

(54) UNIFORM TEMPERATURE HEATER

(75) Inventor: Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 542 days.

(21) Appl. No.: 12/366,733

(22) Filed: Feb. 6, 2009

(65) Prior Publication Data

US 2009/0200289 A1 Aug. 13, 2009

Related U.S. Application Data

(60) Provisional application No. 61/027,114, filed on Feb. 8, 2008.

(51) Int. Cl.
*H05B 3/68* (2006.01)
*C23C 16/00* (2006.01)

(52) U.S. Cl. .................................. 219/444.1; 118/725

(58) Field of Classification Search ............ 219/385, 219/438, 391, 395, 397, 399, 402, 408, 409, 219/410, 417, 443.1, 441.1, 451.1, 460.1, 219/461.1, 467.1, 465.1, 466.1, 468, 538, 219/539, 542, 543, 544, 545, 548, 552, 553; 118/725, 724
See application file for complete search history.

(56) References Cited

U.S. PATENT DOCUMENTS

| | | | | |
|---|---|---|---|---|
| 5,331,134 A | * | 7/1994 | Kimura | 219/543 |
| 6,225,606 B1 | | 5/2001 | Tsuruta et al. | |
| 6,376,811 B2 | * | 4/2002 | Yamaguchi et al. | 219/468.1 |
| 6,423,949 B1 | * | 7/2002 | Chen et al. | 219/444.1 |
| 6,437,299 B1 | * | 8/2002 | Watanabe et al. | 219/478 |
| 6,617,553 B2 | * | 9/2003 | Ho et al. | 219/444.1 |
| 7,560,668 B2 | * | 7/2009 | Tomita et al. | 219/444.1 |
| 2003/0062359 A1 | | 4/2003 | Ho et al. | |

FOREIGN PATENT DOCUMENTS

| | | |
|---|---|---|
| JP | 11-204238 A1 | 7/1999 |
| JP | 2002-373862 A1 | 12/2002 |
| JP | 2006-500789 A1 | 1/2006 |

* cited by examiner

*Primary Examiner* — Geoffrey S Evans
*Assistant Examiner* — Thomas Ward
(74) *Attorney, Agent, or Firm* — Burr & Brown

(57) ABSTRACT

A heating unit includes: a base having an upper surface; a first heating element buried in an upper part of the base, the upper part including the upper surface, the first heating element having a flat shape almost parallel to the upper surface; and a second heating element buried in a lower part of the base and arranged in a location lower than the first heating element with respect to the upper surface, the lower part being joined to the upper part, and the second heating element having a flat shape. First and second projection patterns have an overlapping portion where the first projection pattern and the second projection pattern partially overlap each other, the first projection pattern representing the first heating element projected on the upper surface of the base, and the second projection pattern representing the second heating element projected the upper surface of the base.

5 Claims, 8 Drawing Sheets

| SAMPLE NUMBER | PROJECTION AREA OCCUPATION RATIO (%) | MAX. DIFFERNCE IN LOCAL TEMPERATURE (°C) | AVERAGE OVERLAP RATIO (%) | |
|---|---|---|---|---|
| | | | INNER PERIPHERAL PART | OUTER PERIPHERAL PART |
| 1 | 94 | 0.65 | 5 | 5 |
| 2 | 85 | 1 | 5 | 5 |
| 3 | 83 | 1.75 | 5 | 5 |
| 4 | 79 | 2.2 | 5 | 5 |
| 5 | 73 | 2.55 | 5 | 5 |
| 6 | 94 | 0.45 | 20 | 30 |
| 7 | 90 | 0.56 | 20 | 30 |
| 8 | 86 | 0.75 | 20 | 30 |
| 9 | 83 | 1.55 | 20 | 30 |
| 10 | 79 | 1.95 | 20 | 30 |
| 11 | 86 | 1.95 | 2 | 3 |
| 12 | 82 | 2.25 | 1.5 | 3.5 |
| 13 | 89 | 1.1 | 30 | 40 |
| 14 | 85 | 1.35 | 30 | 40 |
| 15 | 67 | 3.4 | 5 | 5 |

UNIFORM TEMPERATURE HEATER

BACKGROUND OF THE INVENTION

1. Field of the Invention

The present invention relates to a heating unit configured to heat a process object placed on the heating unit.

2. Description of the Related Art

A semiconductor device manufacturing apparatus or the like with which a chemical vapor deposition (CVD) step, a dry-etching step, and the like are performed, uses a heating unit configured to heat a substrate serving as an object to be processed, and being placed on the heating unit. The heating unit includes a resistance heating element as a heater. The resistance heating element is buried in a placement surface which is almost parallel to a surface of a base made of an insulating material such as a ceramic. In general, a coil-shaped heating wire and a flat-shaped heating wire such as a mesh, a screen-printed body or foil are used as a resistance heating element (see Japanese Patent Application Publication No. Hei 11-204238).

Hereinafter, descriptions will be given, for example, of a coil-shaped heating wire used as a resistance heating element. The coil-shaped heating wire has multiple corner portions each curved with a certain curvature. This structure makes it difficult to arrange the coil-shaped heating wires side by side without leaving any space therebetween in the placement surface almost parallel to the surface of the base made of an insulating material. As a result, temperature distribution corresponding to the coil shape (referred to as a "wiring pattern") of the coil-shaped heating wires is caused in the surface of the base. Depending on the temperature distribution thus caused, the thickness of a film deposited on the substrate and the etching depth vary. This variation reduces the yields.

A shifted arrangement of two coil-shaped heating wires has been proposed as measures to solve the problem of temperature distribution which occurs in the surface of the base, and which corresponds to the wiring pattern of the coil-shaped heating wire (see Japanese Patent Translation Publication No. 2006-500789). Nevertheless, it is disclosed that the coil-shaped heating wires cause local temperature distribution with a variation of approximately several degrees Celsius. In other words, the temperature distribution corresponding to the wiring pattern cannot be eliminated by the proposed measures fully.

In a case where a flat-shaped heating wire such as a mesh (sheet formed by weaving metallic wires into a wire sheet shape), a screen-printed body or foil is used as a resistance heating element, ingenious arrangement of the wiring pattern of the flat-shaped heating wire makes it possible to reduce an area which is not directly heated by the heating wire in the surface of the base. When, however, multiple flat-shaped heating wires are placed in the same surface, areas which are put aside for securing an insulation distance between the flat-shaped heating wires need to be set up. The area set up for securing the insulation distance is not directly heated. In other words, the temperature distribution corresponding to the wiring pattern cannot be eliminated fully by such a flat-shaped heating wire used as the resistance heating element.

Another proposal is made on a scheme of stacking multiple ceramic green sheets as follows. Heating elements are formed in the upper surfaces of the respective ceramic green sheets. The heating elements are shifted from one another when viewed as a plan view from the top surface of the substrate on which the wiring patterns of the heating elements are placed (see Japanese Patent Application Publication No. 2002-373862). Even with this scheme, in contrary, it is actually difficult to even out the temperature throughout the surface of the bases, because the wiring patterns of the respective heating elements do not overlap one another in some locations when viewed in the same plane.

SUMMARY OF THE INVENTION

An object of the present invention is to provide a heating unit capable of reducing local temperature distribution. An aspect of the present invention provides a heating unit comprising: a base having an upper surface on which an object to be processed is placed; a first heating element buried in an upper part of the base, the upper part including the upper surface, the first heating element having a flat shape almost parallel to the upper surface; and a second heating element buried in a lower part of the base and arranged in a location lower than the first heating element with respect to the upper surface in a direction orthogonal to the upper surface, the lower part being joined to the upper part, and the second heating element having a flat shape, wherein a first projection pattern and a second projection pattern have an overlapping portion where the first projection pattern and the second projection pattern partially overlap each other, the first projection pattern representing the first heating element projected on the upper surface of the base, and the second projection pattern representing the second heating element projected on the upper surface of the base, an occupation ratio of an aggregate area of the first projection pattern and the second projection pattern to an area of the upper surface is not less than 85%, and an overlap ratio defined as a ratio of an area of the overlapping portion to an area of the second projection pattern in the upper surface is not less than 5%.

DETAILED DESCRIPTION OF THE INVENTION

Figure 1:
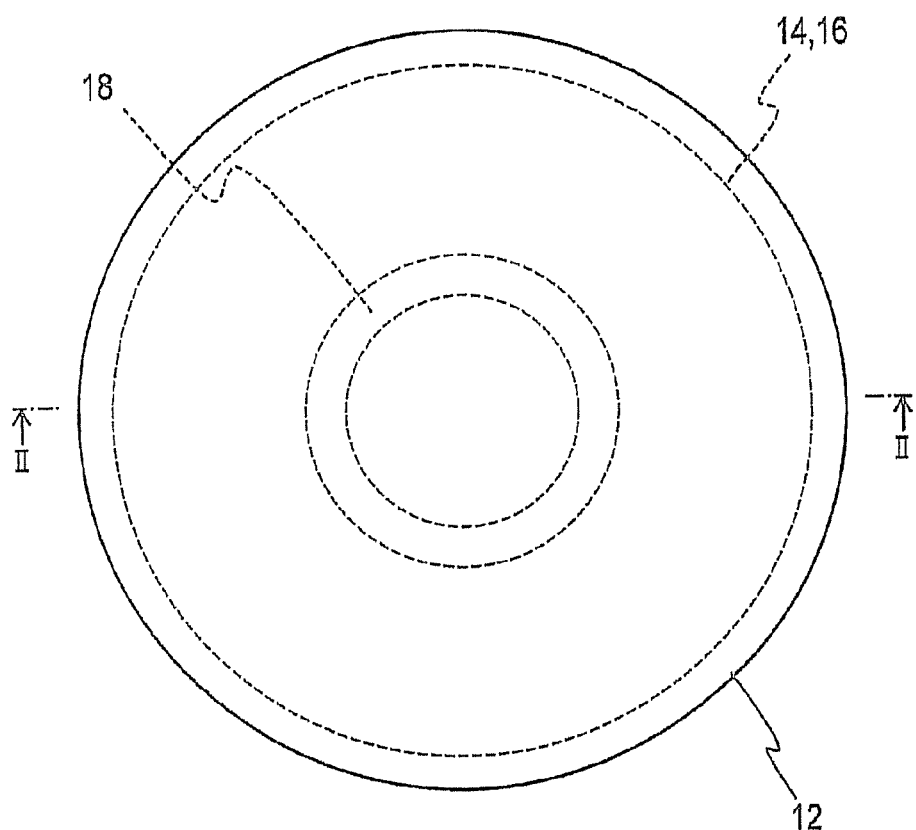
FIG. 1 is a plan view showing an example of a heating unit according to an embodiment of the present invention.

Descriptions will be provided hereinbelow for an embodiment of the present invention by referring to the drawings. In the following drawings, the same or similar parts will be denoted by the same or similar reference numerals. It should be noted that the drawings are schematic, and that a relationship between the thickness and plan dimensions of each part as well as a thickness ratio of one layer to another in each drawing is different from actual one. For this reason, a specific thickness and dimensions of each part should be determined with the following descriptions taken into consideration. In addition, it goes without saying that some of the drawings include a part whose dimensional relationship is different from that of the part in the other drawing and parts whose thickness ratio is different from that of the parts in the other drawing.

Figure 2:
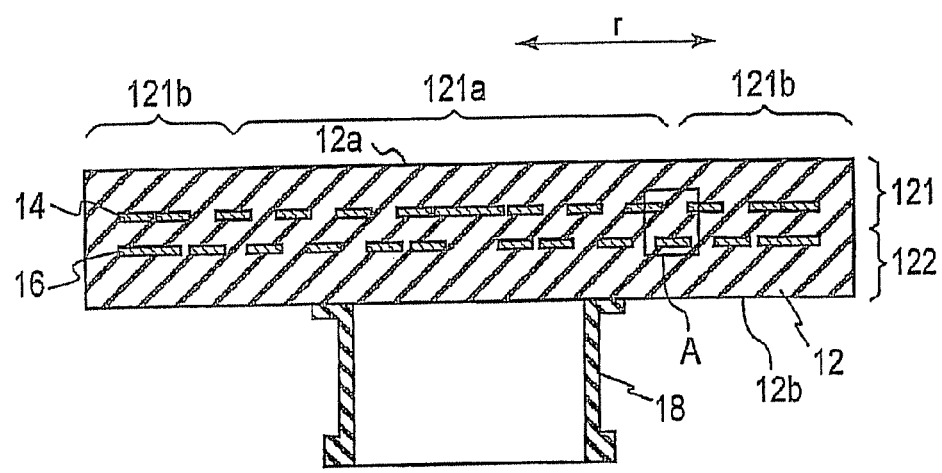
FIG. 2 is a cross-sectional view schematically showing a substrate holding body taken along the II-II line of FIG. 1.

As shown in FIGS. 1 and 2, a heating unit according to the embodiment of the present invention includes a base 12 with buried electrodes and a shaft 18. The base 12 includes an upper part 121 and a lower part 122. The buried electrodes include flat type first and second heating (i.e., resistive) elements 14, 16. The first heating element 14 is buried in the upper part 121 of the base 12. The upper part 121 includes an upper surface 12a of the heating unit on which a substrate is placed. The upper surface 12a includes an inner peripheral part 121a and an outer peripheral part 121b.

The lower part 122 is joined to the opposite surface of the upper part 121 from the upper surface 12a. The second heating element 16 is arranged in a location which is farther away from the upper surface 12a in a direction orthogonal to the upper surface 12a than a location where the first heating element 14 is buried.

The lower part 122 includes a lower surface 12b on the opposite side of the lower part 122 from the surface where the lower part 122 and the upper part 121 are joined together. The shaft 18 is joined to the lower surface 12b of the base 12.

The heating unit is fixed to a processing chamber of a CVD apparatus or a plasma etching apparatus by use of the shaft 18. If, for instance, the substrate as an object to be processed is a circular semiconductor substrate, the heating unit is shaped like a disc. The substrate is heated by the buried electrodes with the substrate being placed on the upper surface 12a of the heating unit. Electrode terminals (not illustrated) are connected to the respective buried electrodes. Note that the shape of the heating unit is not limited to the disc. The heating unit may be shaped like a polygon, for instance. In addition, depending on the necessity, the upper surface 12a on which the substrate is placed is formed into a flat shape, pocket shape, embossed shape, or grooved shape.

For instance, the base 12 has a diameter Ds of approximately 330 mm to approximately 340 mm, and a thickness H of approximately 20 mm to approximately 30 mm. The buried electrodes have a diameter Dh of approximately 320 mm to approximately 335 mm. The first heating element 14 is buried in the upper part of the base 12. The second heating element 16 is arranged below the first heating element 14 in the inside of the base 12.

A ceramic material such as aluminum nitride (AlN), alumina ($Al_2O_3$), silicon nitride ($Si_3N_4$), silicon carbide (SiC) or boron nitride (BN) is used for the base 12 and the shaft 18. Otherwise, a metal material such as aluminum (Al), an aluminum alloy, or a stainless steel may be used for the base 12. In a case where a metal material is used, electrodes insulated by ceramic coating are used as the buried electrodes.

A mesh made of a conductive material such as a refractory metal or a refractory metal carbide is used as the first and second heating elements 14, 16. Examples of the refractory metal include tungsten (W), molybdenum (Mo) and niobium (Nb). Examples of the refractory metal carbide include tungsten carbide (WC). Note that a screen-printed body, foil or the like which is made of one of the above-mentioned conductive materials may be used for the first and second heating elements 14, 16.

Figure 3:
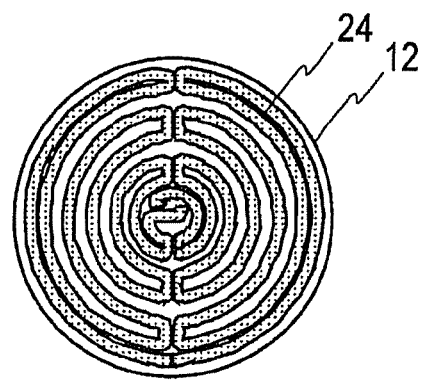
FIG. 3 is a diagram showing an example of a first projection pattern which is used to explain the embodiment of the present invention.
Figure 4:
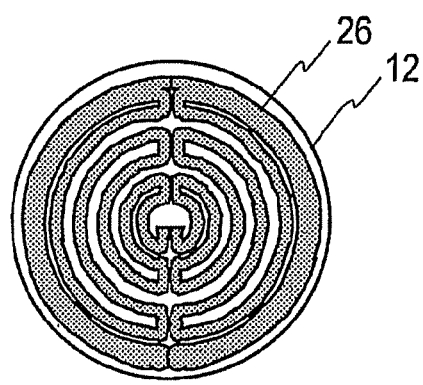
FIG. 4 is a diagram showing an example of a second projection pattern which is used to explain the embodiment of the present invention.
Figure 5:
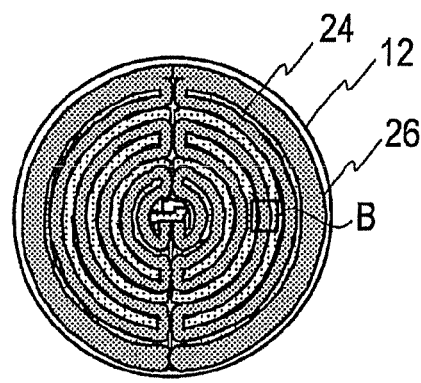
FIG. 5 is a diagram showing a result of overlapping the projection patterns shown in FIGS. 3 and 4.

FIG. 3 shows a first projection pattern 24 representing the first heating element 14 projected on the upper surface 12a of the base 12. FIG. 4 shows a second projection pattern 26 representing the second heating element 16 projected on the upper surface 12a of the base 12. As shown in FIG. 5, the second projection pattern 26 overlaps a gap in the first projection pattern 24.

Figure 6:
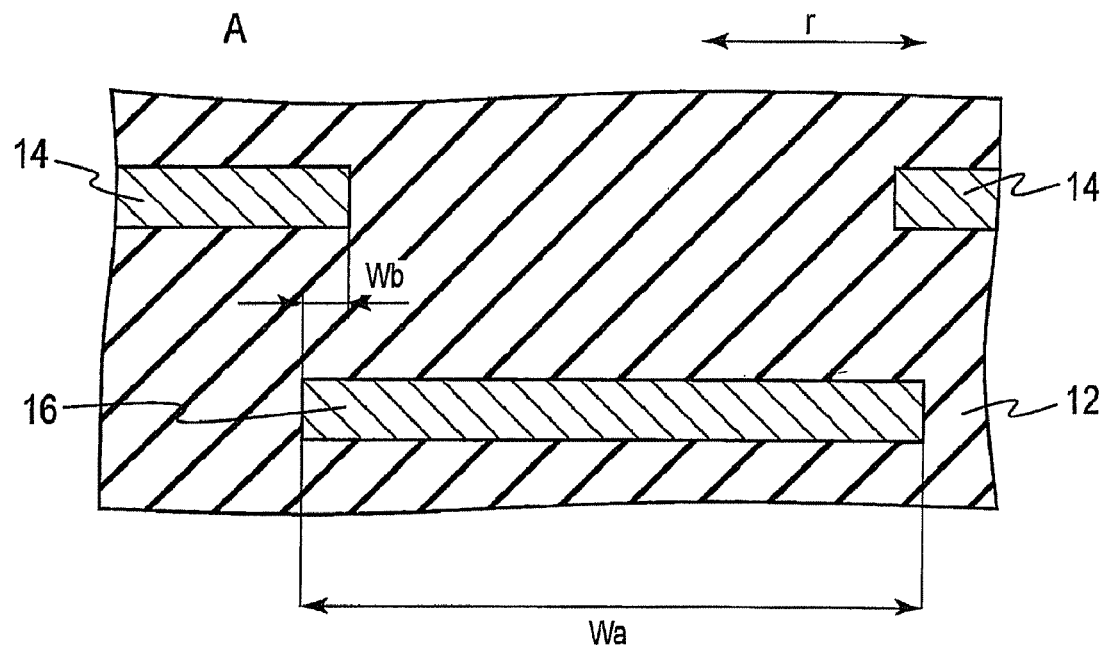
FIG. 6 is a magnified view showing magnified part of the cross-sectional view of FIG. 2.
Figure 7:
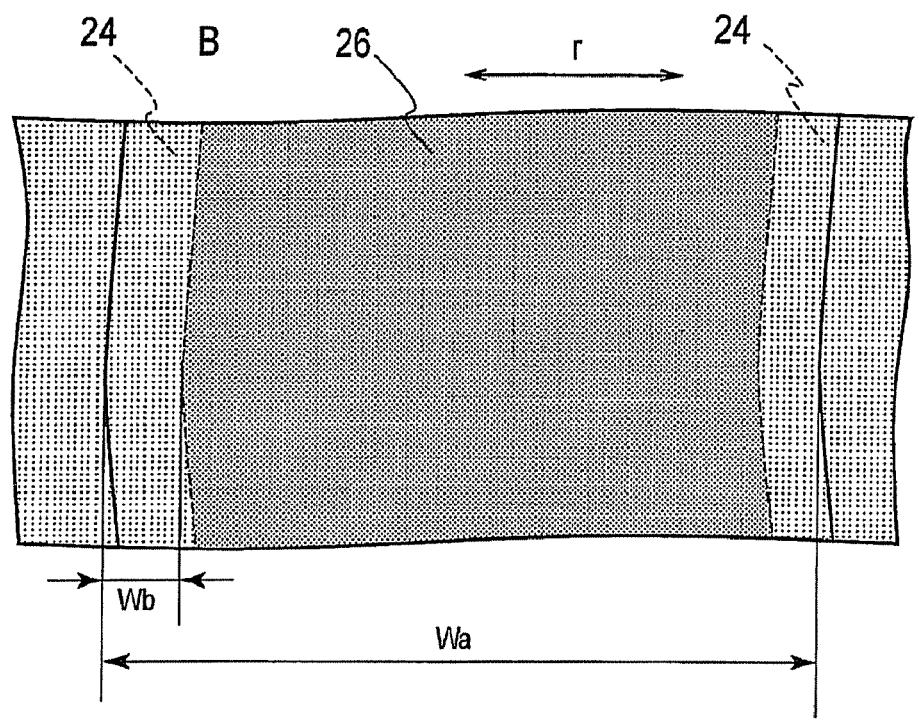
FIG. 7 is a magnified view showing magnified part of the plan view of FIG. 5.

FIG. 6 is a magnified view showing a magnified area A shown in the cross-sectional view of FIG. 2. FIG. 7 is a magnified view showing a magnified area B shown in the plan view of FIG. 5.

In FIG. 6, reference letters Wa denotes the length of the second heating element 16 in a radial direction of the base 12. An end portion of the first heating element 14 overlaps an end portion of the second heating element 16 in the direction orthogonal to the upper surface 12a of the base 12. In this manner, at least one end portion of the first heating element 14 overlaps the neighboring end portion of the second heating element 16. Reference letters Wb denotes the length of each overlapping portion.

In FIG. 7, reference letters Wa denotes the length of the second projection pattern 26 in the radial direction of the base 12, the second projection pattern 26 representing the second heating element 16 projected on the upper surface 12a of the base 12. The first projection pattern 24, which represents the first heating element 14 projected on the upper surface 12a of the base 12, partially overlaps with the second projection pattern 26. Reference numeral Wb denotes the length of the overlapping portion.

Figure 13:
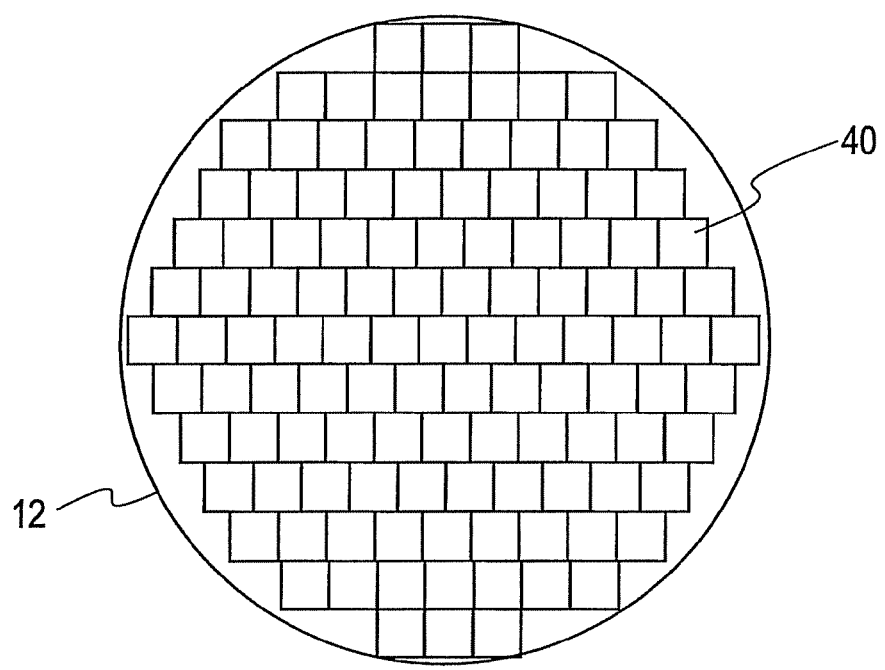
FIG. 13 is a diagram showing an example of blocks set up in an upper surface of the heating unit which are used to explain the embodiment of the present invention.

An overlap ratio is defined as a ratio of the length Wb of the overlapping portion between the first heating element 14 and the second heating element 16 to the length Wa of the second heating element 16 in the radial direction in a single block 40 shown in FIG. 13 which will be described later. An average overlap ratio between the first heating element 14 and the second heating element 16 is defined as an average of the overlap ratios of all the blocks 40. It is desirable that the average overlap ratio should be 5% or more.

As shown in FIGS. 6 and 7, the length Wa of the second heating element 16 in the radial direction is equal to the length Wa of the second projection pattern 26. In addition, the length Wb of the overlapping portion between the first heating element 14 and the second heating element 16 is equal to the length Wb of the overlapping portion between the first projection pattern 24 and the second projection pattern 26. For this reason, the overlap ratios and the average overlap ratio between the first heating element 14 and the second heating element 16 are respectively equal to the overlap ratios and the average overlap ratio between the first projection pattern 24 and the second projection pattern 26.

The reason why, as mentioned above, the desirable average overlap ratio should be 5% or more is that, if the average overlap ratio is less than 5%, the temperature difference in the upper surface 12a becomes larger between the areas where the first projection patterns 24 and the second projection patterns 26 overlap each other and the areas where the first projection patterns 24 and the second projection patterns 26 do not overlap each other.

In general, heat radially transmits in an object from a heating element as a heat source. For this reason, as the distance from the heat source to a certain point in the object becomes larger, temperature is more evenly distributed in the cross-section of the object including the point. In other words, temperature can be evenly distributed in the upper surface 12a if the distance from the heating element to the upper surface 12a is set up larger. However, if the base 12 is constructed thick, the manufacturing cost is increased, and also it becomes difficult to keep the base 12 homogeneous in quality while the base 12 is being baked.

With this taken into consideration, it is practical that the thickness of the base 12 should be approximately 20 mm to approximately 30 mm. It is desirable that the distance between the upper surface 12a of the base 12 and the first heating element 14 should be approximately 5 mm to approximately 10 mm.

Figure 8:
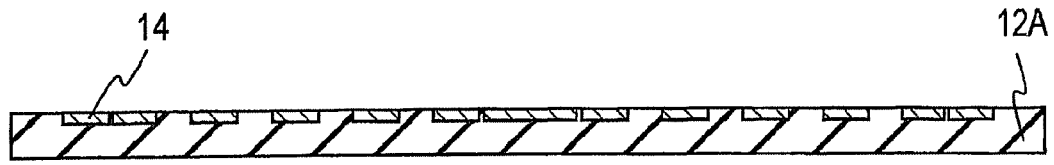
FIG. 8 is a cross-sectional view (Part 1) showing an example of a method of manufacturing a substrate holding body according to the embodiment of the present invention.
Figure 9:
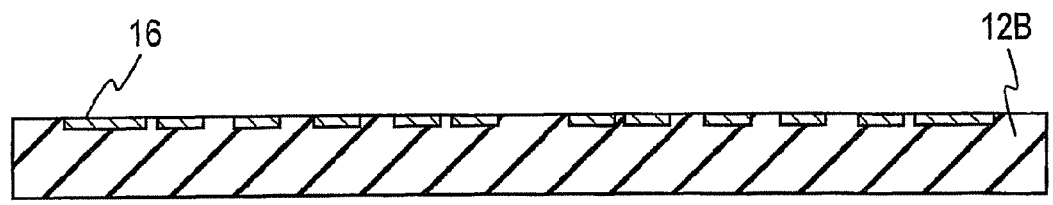
FIG. 9 is another cross-sectional view (Part 2) showing the example of the method of manufacturing a substrate holding body according to the embodiment of the present invention.
Figure 10:
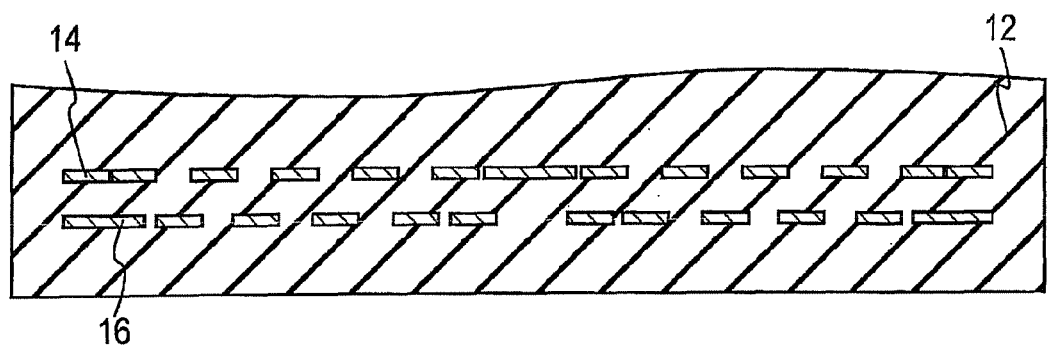
FIG. 10 is yet another cross-sectional view (Part 3) showing the example of the method of manufacturing a substrate holding body according to the embodiment of the present invention.

Hereinbelow, descriptions will be provided for a method of manufacturing the heating unit shown in FIGS. 1 and 2 by use of FIGS. 8 to 11. FIGS. 8 to 10 are cross-sectional views of members (ceramic sinter members 12A, 12B which will be described later) constituting part of the base 12.

(a) First of all, the ceramic sinter member 12A is prepared with grooves being formed in the front surface of the ceramic sinter member 12A. Subsequently, as shown in FIG. 8, the flat type first heating elements 14 each of which is made of a mesh formed by use of a conductive material such as tungsten (W) are fitted into the grooves in the ceramic sinter member 12A.

(b) Similarly, the ceramic sinter member 12B is prepared with grooves being formed in the front surface of the ceramic sinter member 12B. Subsequently, as shown in FIG. 9, the flat type second heating elements 16 each of which is made of a mesh formed by use of a conductive material such as tungsten (W) are fitted into the grooves in the ceramic sinter member 12B.

(c) Thereafter, the ceramic sinter member 12A and the ceramic sinter member 12B are overlapped each other. Thereby, an end portion of each first heating element 14 overlaps an end portion of the neighboring second heating element 16 when viewed as a plan view in the direction orthogonal to the upper surface 12a. Afterward, the ceramic sinter member 12A and the ceramic sinter member 12B are press-molded and sintered while being overlapped each other. By this, the base 12 in which the first heating elements 14 and the second heating elements 16 are buried is produced as shown n in FIG. 10.

Figure 11:
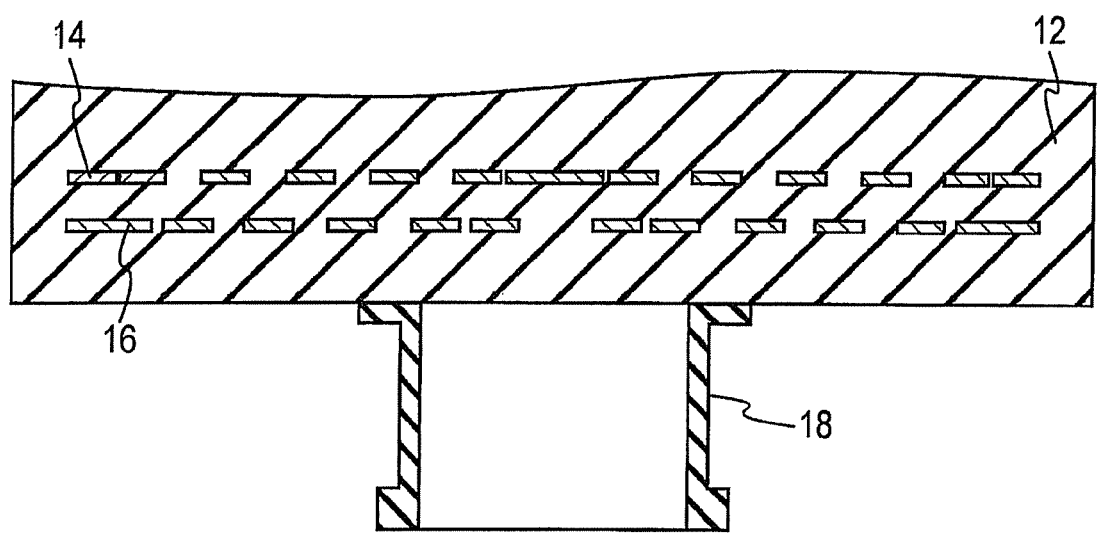
FIG. 11 is still another cross-sectional view (Part 4) showing the example of the method of manufacturing a substrate holding body according to the embodiment of the present invention.

(d) As shown FIG. 11, the shaft 18 made of a cylinder-shaped ceramic sinter member which is sintered separately from the ceramic sinter member 12A and the ceramic sinter member 12B is joined to a surface of the base 12. Subsequently, the opposite surface of the base 12 from the surface to which the shaft 18 is joined is polished. The polished surface constitutes the upper surface 12a of the base 12. In other words, the shaft 18 is joined to the lower surface 12b of the base 12. The heating unit shown in FIGS. 1 and 2 is produced in this manner.

Figure 12:
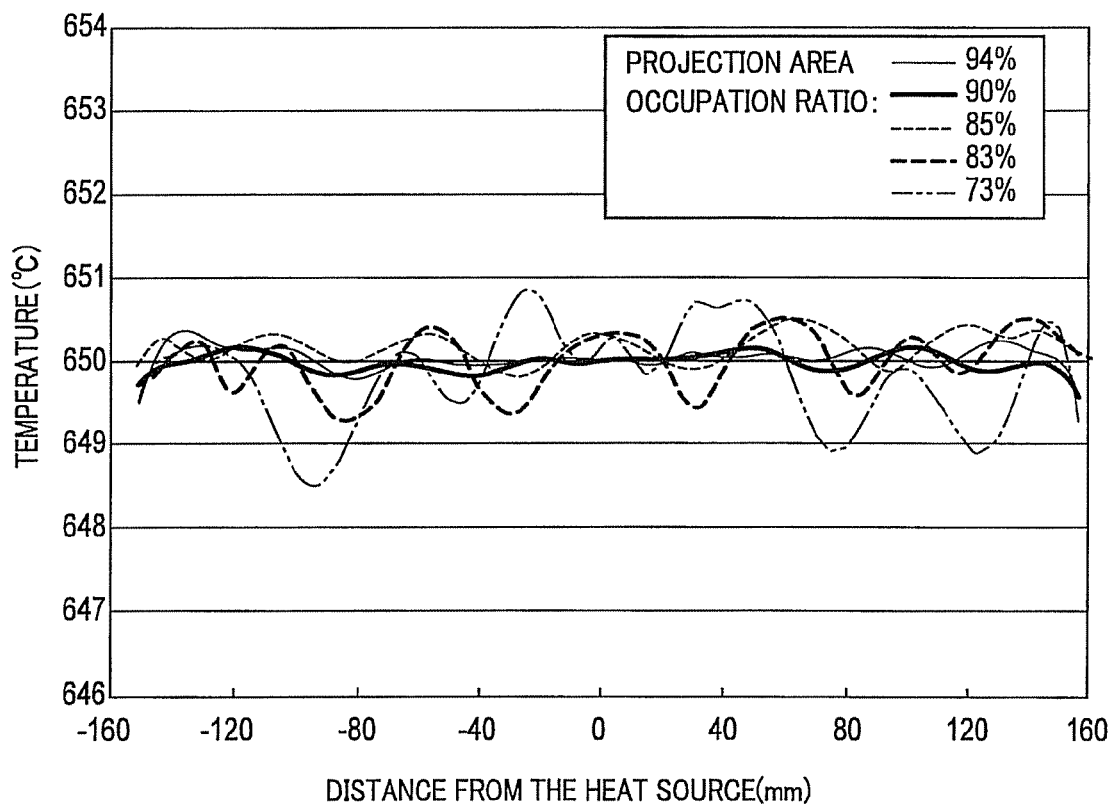
FIG. 12 is a diagram showing an example of temperature distributions which occur in the heating unit according to the embodiment of the present invention.

Heating units were prepared having different ratios of the aggregate area of the first projection pattern 24 and the second projection pattern 26 to the area of the upper surface 12a of the base 12. For each heating unit, temperature distribution in the upper surface 12a in the radial direction r was measured by use of a temperature measuring device such as an infrared camera. The result of the measurement is shown in FIG. 12. When viewed as a plan view in the direction orthogonal to the upper surface 12a, the average overlap ratio between the first heating element 14 and the second heating element 16 was approximately 5%.

As shown in FIG. 12, as the ratio of the aggregate area of the first projection pattern 24 and the second projection pattern 26 to the area of the upper surface 12a increases from 73% to 94%, the temperature distribution in the upper surface 12a in the radial direction r becomes more even. As shown in FIG. 13, the upper surface 12a is divided into multiple squared blocks 40 with a dimension of approximately 25 mm×approximately 25 mm. For each block 40, the temperature was measured. Thereby, a maximum difference in temperature (local temperature) among the blocks 40 in the upper surface 12a was measured.

Figures 14, 15:
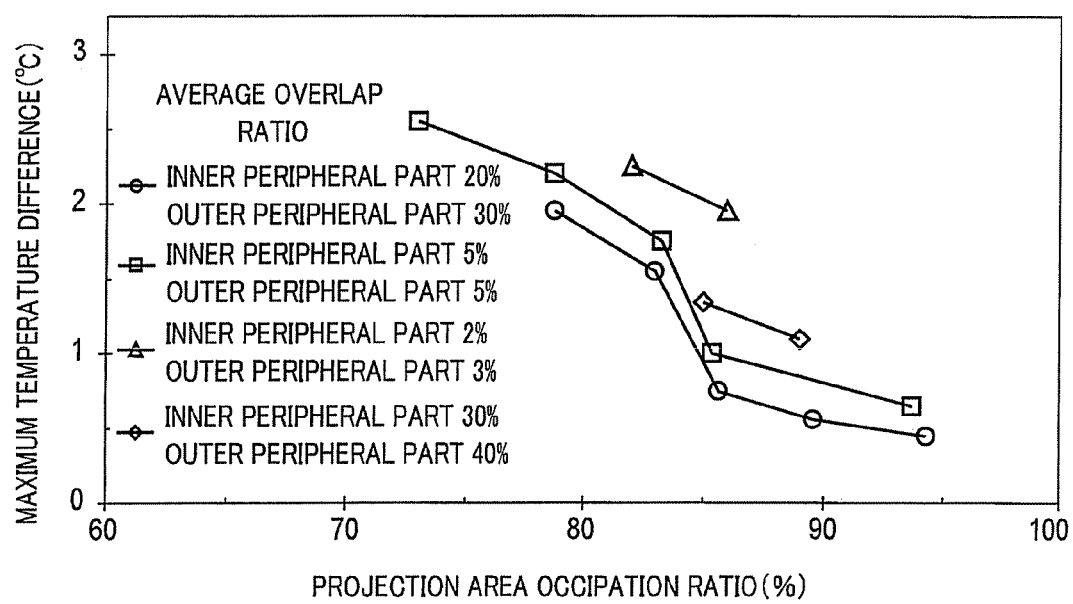
FIG. 14 is a table showing occupation ratios and maximum local temperature differences in an associated manner with regard to the heating unit according to the embodiment of the present invention, where the occupation ratio is defined as a ratio of an aggregate amount of the area of the first projection pattern and the area of the second projection pattern to the area of the upper surface of the heating unit.
FIG. 15 is a diagram showing an example of relationships between the occupation ratios and the maximum local temperature differences where the occupation ratio is defined as a ratio of an aggregate area of the first projection pattern 24 and the second projection pattern 26 to the area of the upper surface of the heating unit according to the embodiment of the present invention.

A table in FIG. 14 shows a result of comparing the maximum difference in local temperature among the heating units each having the different occupation ratio (referred to as a "projection area occupation ratio") of the aggregate area of the first projection pattern 24 and the second projection pattern 26 to the area of the upper surface 12a.

As shown in FIG. 14, the projection area occupation ratio of Sample 1 was 94%, and the maximum difference in local temperature of Sample 1 was 0.65° C. The projection area occupation ratio of Sample 2 was 85%, and the maximum difference in local temperature of Sample 2 was 1° C. The projection area occupation ratio of Sample 3 was 83%, and the maximum difference in local temperature of Sample 3 was 1.75° C. The projection area occupation ratio of Sample 4 was 79%, and the maximum difference in local temperature of Sample 4 was 2.2° C. The projection area occupation ratio of Sample 5 was 73%, and the maximum difference in local temperature of Sample 5 was 2.55° C. The maximum difference in local temperature of each of Sample 1 and Sample 2 was smaller than that of each of Samples 3, 4 and 5.

FIG. 15 shows a relationship between the projection area occupation ratio of the aggregate area of the first projection pattern 24 and the second projection pattern 26 to the area of the upper surface 12a and the maximum difference in local temperature in each heating unit. As shown in FIG. 15, the maximum difference in local temperature in the upper surface 12a was approximately 1° C. or less in each heating unit when the projection area occupation ratio was approximately 85% or more. On the contrary, the maximum difference in local temperature in the upper surface 12a was larger in each heating unit when the projection area occupation ratio was approximately 85% or less.

As shown in FIG. 14, the projection area occupation ratio of Sample 6 was 94%, and the maximum difference in local temperature of Sample 6 was 0.45° C. The projection area occupation ratio of Sample 7 was 90%, and the maximum difference in local temperature of Sample 7 was 0.56° C. The projection area occupation ratio of Sample 8 was 86%, and the maximum difference in local temperature of Sample 8 was 0.75° C.

In the case of Samples 6, 7 and 8, the average overlap ratio between the first heating element 14 and the second heating element 16 in the inner peripheral part 121a of the upper surface 12a was unequal to the average overlap ratio between the first heating element 14 and the second heating element 16 in the outer peripheral part 121b.

Specifically, the average overlap ratio in the inner peripheral part 121a was approximately 20%. The average overlap ratio in the outer peripheral part 121b was approximately 30%. In other words, the average overlap ratio between the first heating element 14 and the second heating element 16 in the outer peripheral part 121b was larger than the average overlap ratio between the first heating element 14 and the second heating element 16 in the inner peripheral part 121a. In this respect, the outer peripheral part 121b is defined as an area between an outer edge of the upper surface 12a and an outer perimeter of a concentric circle whose radius is shorter than that of the upper surface 12a by approximately 30%.

As shown in FIGS. 14 and 15, when the average overlap ratio between the first heating element 14 and the second heating element 16 in the outer peripheral part 121b is increased, the difference in local temperature decreases. Thus, the increase in the average overlap ratio makes it possible to evenly distribute the temperature in the upper surface 12a. It is desirable that the amount of heat radiated from the outer peripheral part 121b should be increased, and concurrently that the amount of heat generated by the outer peripheral part 121b should be increased. To this end, the amount of heat generated by the outer peripheral part 121b is increased by increasing the length Wb of the overlapping portion between the first heating element 14 and the second heating element 16 when viewed as a plan view in the direction orthogonal to the upper surface 12a.

It is desirable that the average overlap ratio between the first heating element 14 and the second heating element 16 in the inner peripheral part 121a should be 5% to 20%. In addition, it is desirable that the average overlap ratio between the first heating element 14 and the second heating element 16 in the outer peripheral part 121b should be 5% to 30%. If both the average overlap ratio in the inner peripheral part 121a and the average overlap ratio in the outer peripheral part 121b are less than 5%, an area where the first projection pattern 24 formed in the upper surface 12a does not overlap the second projection pattern 26 formed in the upper surface 12a is formed. This tends to cause the difference in local temperature.

The projection area occupation ratio of Sample 11 was 86%, and the maximum difference in local temperature of Sample 11 was 1.95° C. In the case of Sample 11, the average overlap ratio between the first heating element 14 and the second heating element 16 in the inner peripheral part 121a was 2%, and the average overlap ratio between the first heating element 14 and the second heating element 16 in the outer peripheral part 121b was 3%.

Furthermore, the projection area occupation ratio of Sample 12 was 82%, and the maximum difference in local temperature of Sample 12 was 2.25° C. In the case of Sample 12, the average overlap ratio between the first heating element 14 and the second heating element 16 in the inner peripheral part 121a was 1.5%, and the average overlap ratio between the first heating element 14 and the second heating element 16 in the outer peripheral part 121b was 3.5%.

In the case of Samples 11 and 12, although the projection area occupation ratio was close to 85%, the maximum difference in local temperature was approximate 2° C. This reason is considered as follows. The area where the first projection pattern 24 and the second projection pattern 26 do not overlap each other is increased, so that the difference in local temperature is increased.

The projection area occupation ratio of Sample 13 was 89%, and the maximum difference in local temperature of the Sample 13 was 1.1° C. The projection area occupation ratio of Sample 14 was 85%, and the maximum difference in local temperature of Sample 14 was 1.35° C. In the case of Samples 13 and 14, the average overlap ratio between the first heating element 14 and the second heating element 16 in the inner peripheral part 121a was 30%, and the average overlap ratio between the first heating element 14 and the second heating element 16 in the outer peripheral part 121b was 40%.

In the case of each of Samples 13 and 14, although the projection area occupation ratio was approximately 85% to approximately 89%, the difference in local temperature was approximately 1° C. or more. This reason is considered as follows. The amount of heat radiated from the inner peripheral part 121a was smaller than the amount of heat radiated from the outer peripheral part 121b. Specifically, due to the smaller amount of heat radiation from the inner peripheral part 121a, a locally-overheated area (hot spot) was easy to occur in the inner peripheral part 121a when the average overlap ratio between the first heating element 14 and the second heating element 16 in the inner peripheral part 121a reached 30%. As a result, heat conducted from the hot spot disturbed the balance between the heat generation and heat radiation in the outer peripheral part 121b, increasing the difference in local temperature.

As described above, it was found that, when both the average overlap ratio between the first heating element 14 and the second heating element 16 in the inner peripheral part 121a and the average overlap ratio between the first heating element 14 and the second heating element 16 in the outer peripheral part 121b were 5%, and concurrently when the projection area occupation ratio was 85%, the heat generation and heat radiation were balanced well, and the maximum difference in local temperature in the upper surface 12a was approximately 1° C. or less.

In addition, it was found that, when the average overlap ratio between the first heating element 14 and the second heating element 16 in the inner peripheral part 121a was 20%, when the average overlap ratio between the first heating element 14 and the second heating element 16 in the outer peripheral part 121b was 30%, and concurrently when the projection area occupation ratio was 85%, the heat generation and heat radiation were balanced well, and the maximum difference in local temperature in the upper surface 12a was approximately 1° C. or less.

Note that Sample 15 was a heating unit according to a comparative example which was produced in accordance with the structure described in Japanese Patent Application Publication No. 2002-373862. Instead of the ceramic sinter members 12A and 12B shown in FIGS. 8 and 9, ceramic green sheets were used for Sample 15. The projection area occupation ratio of Sample 15 was 67%. The maximum difference in local temperature of Sample 15 calculated from the measured temperature distribution was approximately 3.4%.

Figure 16:
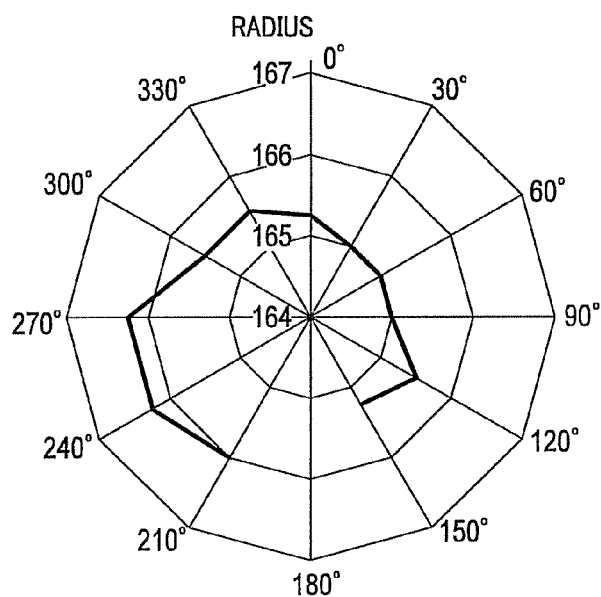
FIG. 16 is a diagram showing an example of deformation of a heating element in a heating unit according to a comparative example.
Figure 17:
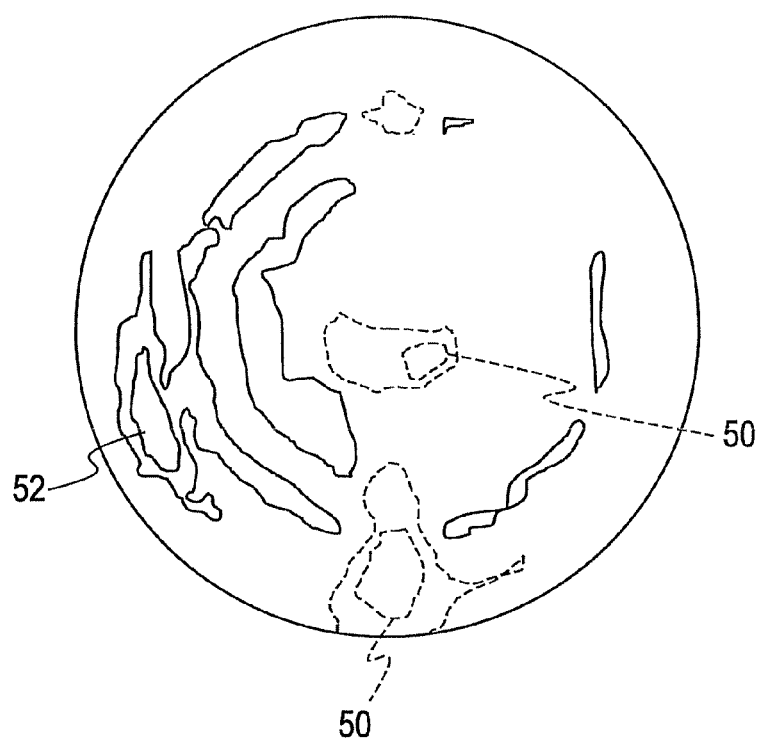
FIG. 17 is a diagram showing an example of temperature distribution which occurs in the heating unit according to the comparative example.

The amount of deformation of the buried electrodes in the heating unit as Sample 15 was measured by radiography. FIG. 16 shows the amount of deformation of an outermost heating element in the upper surface of the heating unit as Sample 15. There was no heating element in an outermost area in a sector of the upper surface which subtends an azimuth angle between approximately 150° to approximately 210°. It was learned that the heating element deformed and thus bent outward in an outermost area in a sector of the upper surface which subtended an azimuth angle between approximately 210° and approximately 300°. This reason is considered that, while the heating unit was being baked, the heating element deformed due to the difference in coefficient of thermal expansion between the ceramic green sheet and the heating element. FIG. 17 is a diagram showing an example of temperature distribution in the upper surface of the heating unit. As shown in FIG. 17, a hot spot 52 and cool spots 50 were observed in the upper surface of Sample 15. The hot spot 52 corresponded to an area where the heating element deformed and bent outward. Each cool spot 50 corresponded to an area where no heating element existed. The difference in temperature between the hot spot 52 and each cool spot 50 was 3° C. or more. The projection area occupation ratio of Sample 15 was small, and the heating element in Sample 15 was easy to deform. As a result, it is difficult to even the temperature throughout the upper surface on which a substrate is placed.

In the case of the heating unit according to the embodiment of the present invention, as described above, the first heating element 14 and the second heating element 16 are arranged in the inside of the substrate 11 so that the projection area occupation ratio of the aggregate area of the first projection pattern 24 and the second projection pattern 26 to the area of the upper surface 12a can be 85% or more, and so that the average overlap ratio between the first heating element 14 and the second heating element 16 (or the average overlap ratio between the first projection pattern 24 and the second projection pattern 26) can be 5%. Consequently, the temperature in the upper surface 12a can be evened.

Moreover, the average overlap ratio between the first heating element 14 and the second heating element 16 is set at 30% or less in the outer peripheral part 121b defined as the area between the outer edge of the upper surface 12a and the outer perimeter of the concentric circle whose radius is shorter than the radius of the upper surface 12a by approximately 30%. Moreover, the average overlap ratio between the first heating element 14 and the second heating element 16 is set at 20% or less in the inner peripheral part 121a. Accordingly, the temperature in the upper surface 12a can be evened.

OTHER EMBODIMENTS

Although the foregoing descriptions have been provided for the embodiment of the present invention, neither the descriptions nor drawings constituting part of this disclosure shall be construed as limiting the present invention to the embodiment. From this disclosure, various alternative embodiments, examples and operational technologies will be clear to those skilled in the art.

It is a matter of course that the present invention includes various embodiments and the like which have not been described herein. For this reason, the technical scope of the present invention shall be defined only by the matter to define the present invention according to the scope of claims which are reasonably understood from the foregoing descriptions.

What is claimed is:
1. A heating unit comprising:
a base having an upper surface on which an object to be processed is placed, the upper surface including an inner peripheral part and an outer peripheral part, with the outer peripheral part being an area between an outer edge of the upper surface and an outer perimeter of a concentric circle whose radius is shorter than that of the upper surface by approximately 30%, and the inner peripheral part being an area that is radially within the area of the outer peripheral part;
a first resistive heating element buried in an upper part of the base, the upper part including the upper surface, the first resistive heating element having a flat shape essentially parallel to the upper surface; and
a second resistive heating element buried in a lower part of the base and arranged in a location lower than the first resistive heating element with respect to the upper surface in a direction orthogonal to the upper surface, the lower part being joined to the upper part, and the second resistive heating element having a flat shape, wherein
a first projection pattern and a second projection pattern have an overlapping portion where the first projection pattern and the second projection pattern partially overlap each other, the first projection pattern representing the first resistive heating element projected on the upper surface of the base, and the second projection pattern representing the second resistive heating element projected on the upper surface of the base,
an occupation ratio of an aggregate area of the first projection pattern and the second projection pattern to an area of the upper surface is 85% to 100%,
an overlap ratio, defined as a ratio of an area of the overlapping portion to an area of the second projection pattern in the upper surface is, from 20% to 30% in the outer peripheral part and 5% to 20% in the inner peripheral part.
2. The heating unit of claim 1, wherein
a material for the base is any one of aluminum nitride and aluminum oxide.
3. The heating unit of claim 1, wherein
a material for the first and second heating elements is any one of molybdenum, niobium, tungsten and tungsten carbide.
4. The heating unit of claim 1, wherein
the first and second heating elements are formed by use of any one of a mesh, a screen-printed body and foil.
5. The heating unit of claim 1, further comprising
a shaft having a cylindrical shape, wherein the shaft is joined to a lower surface of the base.

* * * * *